(12) United States Patent
Murphy (10) Patent No.: US 7,501,670 B2
(45) Date of Patent: Mar. 10, 2009

(54) CASCODE CIRCUIT EMPLOYING A DEPLETION-MODE, GAN-BASED FET

(75) Inventor: Michael Murphy, Somerset, NJ (US)

(73) Assignee: Velox Semiconductor Corporation, Somerset, NJ (US)

( * ) Notice: Subject to any disclaimer, the term of this patent is extended or adjusted under 35 U.S.C. 154(b) by 15 days.

(21) Appl. No.: 11/725,760

(22) Filed: Mar. 20, 2007

(65) Prior Publication Data
US 2008/0230784 A1 Sep. 25, 2008

(51) Int. Cl.
*H01L 31/0328* (2006.01)
(52) U.S. Cl. ............... 257/194; 257/287; 257/392; 257/E29.249; 257/E29.248; 257/E27.061
(58) Field of Classification Search ............. 257/194, 257/E29.249
See application file for complete search history.

(56) References Cited
U.S. PATENT DOCUMENTS

2006/0113593 A1* 6/2006 Sankin et al. ............ 257/341
2007/0215899 A1* 9/2007 Herman .................. 257/147

* cited by examiner

*Primary Examiner*—Tu-Tu V Ho
(74) *Attorney, Agent, or Firm*—Mayer & Williams PC; Stuart H. Mayer, Esq.

(57) ABSTRACT

A circuit includes an input drain, source and gate nodes. The circuit also includes a group III nitride depletion mode FET having a source, drain and gate, wherein the gate of the depletion mode FET is coupled to a potential that maintains the depletion mode FET in its on-state. In addition, the circuit further includes an enhancement mode FET having a source, drain and gate. The source of the depletion mode FET is serially coupled to the drain of the enhancement mode FET. The drain of the depletion mode FET serves as the input drain node, the source of the enhancement mode FET serves as the input source node and the gate of the enhancement mode FET serves as the input gate node.

16 Claims, 6 Drawing Sheets

FIG. 1

PRIOR ART

CASCODE CIRCUIT EMPLOYING A DEPLETION-MODE, GAN-BASED FET

RELATED APPLICATIONS

This application is related to U.S. patent application Ser. No. 11/725,823, entitled "Termination and Contact Structures For A High Voltage GaN-Based Heterojunction Transistor," filed on even date herewith and incorporated by reference in its entirety herein.

This application is also related to U.S. patent application Ser. No. 11/725,820, entitled "High-Voltage GaN-Based Heterojunction Transistor Structure and Method of Forming Same," filed on even date herewith and incorporated by reference in its entirety herein.

FIELD OF THE INVENTION

The present invention relates generally to a Group III nitride compound semiconductor FET such as a GaN-based FET, and more particularly to a circuit that employs a depletion mode GaN-based FET and which functions as an enhancement mode FET.

BACKGROUND OF THE INVENTION

GaN-based FETs using a wide bandgap semiconductor such as GaN, AlGaN, InGaN, AlGaN, AlInGaN and the like have received much attention as a power device for high power application since they are one order of magnitude or more smaller in on-resistance than FETs using Si or GaAs and are hence operable at higher temperature with higher current and can withstand high voltage applications.

Figure 1:
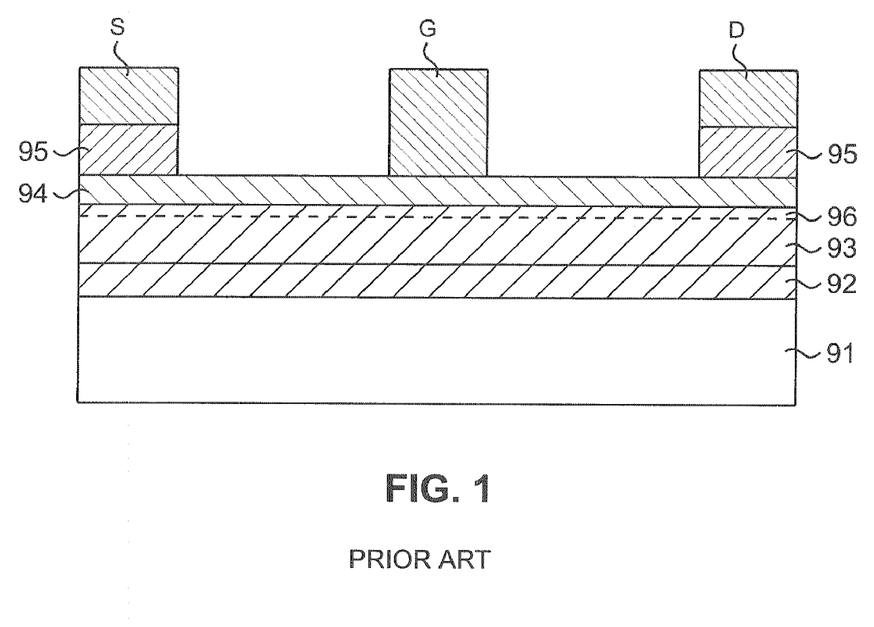
FIG. 1 shows one example of a conventional GaN-based FET.

One example of a conventional GaN-based FET is shown in FIG. 1. As shown, a heterojunction structure is formed on a semi-insulating substrate 91 such as a sapphire substrate. The heterojunction structure includes a buffer layer 92 of GaN, for example, an undoped GaN layer 93, and an undoped AlGaN layer 94, which is generally much thinner than the undoped GaN layer 93. The undoped GaN layer 93 serves as the channel layer. Optionally, two n-AlGaN contact layers 95 are disposed on the undoped AlGaN layer 94. A source electrode S and a drain electrode D are arranged on their respective contact layers 95. A gate electrode G is formed onto the undoped AlGaN layer 94 and is situated between the source electrode S and the drain electrode D. The contact layers 95 may be unnecessary if satisfactory ohmic contact can be established between the source S and drain D electrodes and the underlying semiconductor layer.

The GaN-based FET device is capable of maximizing electron mobility by forming a quantum well at the heterojunction interface between the AlGaN layer, which has a large band gap, and the GaN layer, which has a narrower band gap. As a result, electrons are trapped in the quantum well. The trapped electrons are represented by a two-dimensional electron gas 96 in the undoped GaN layer. The amount of current is controlled by applying voltage to the gate electrode, which is in Schottky contact with the semiconductors so that electrons flow along the channel between the source electrode and the drain electrode.

Even when the gate voltage is zero, electrons will be present in the channel because a piezoelectric field is formed that extends from the substrate toward the device surface. Consequently, the GaN-based FET acts as a depletion-mode (i.e., normally-on) device. For a variety of reasons it would be desirable to provide an enhancement mode (i.e., normally-off) GaN-based FET. For example, when a depletion-mode FET is employed as a switching device for a power source, it is necessary to continuously apply a bias voltage to the gate electrode that is at least equal to the gate threshold value to keep the switch in the off state. Such an arrangement can consume an excessive amount of power. On the other hand, if an enhancement mode FET is employed, the switch can be maintained in the off state even without the application of a voltage, thereby consuming less power. Unfortunately, while attempts have been made to manufacture GaN-based enhanced-mode FETs, they have generally not been satisfactory because of problems such as poor on-state conductances and poor breakdown voltages.

SUMMARY OF THE INVENTION

In accordance with the present invention, a circuit includes an input drain, source and gate nodes. The circuit also includes a group III nitride depletion mode FET having a source, drain and gate, wherein the gate of the depletion mode FET is coupled to a potential that maintains the depletion mode FET in its on-state. In addition, the circuit further includes an enhancement mode FET having a source, drain and gate. The source of the depletion mode FET is serially coupled to the drain of the enhancement mode FET. The drain of the depletion mode FET serves as the input drain node, the source of the enhancement mode FET serves as the input source node and the gate of the enhancement mode FET serves as the input gate node.

In accordance with one aspect of the invention the group III nitride may include GaN.

In accordance with another aspect of the invention, the depletion mode FET may be a high voltage FET having a voltage rating greater than about 100V.

In accordance with another aspect of the invention, the group III nitride depletion mode FET may include a substrate, a first active layer disposed over the substrate, and a second active layer disposed on the first active layer. The second active layer has a higher bandgap than the first active layer such that a two-dimensional electron gas layer arises between the first active layer and the second active layer. A flash layer is disposed on the second active layer and a source, gate and drain contact disposed on the flash layer.

In accordance with another aspect of the invention, the first active layer may comprise GaN and the second active layer may comprise a group III nitride semiconductor material.

In accordance with one aspect of the invention, the second active layer may comprise $Al_xGa_{1-x}N$, wherein $0<X<1$.

In accordance with another aspect of the invention, the second active layer may be selected from the group consisting of AlGaN, AlInN, and AlInGaN.

In accordance with another aspect of the invention, a nucleation layer may be disposed between the substrate and the first active layer.

In accordance with another aspect of the invention, the flash layer may comprise metallic Al.

In accordance with another aspect of the invention, the flash layer may comprise metallic Ga.

In accordance with another aspect of the invention, the flash layer may be an annealed flash layer forming a native oxide layer.

In accordance with another aspect of the invention, the second active layer and the flash layer may include first and second recesses formed therein and the source and drain contacts may be disposed in the first and second recesses, respectively.

DETAILED DESCRIPTION

The present inventor has recognized that instead of fabricating a semiconductor GaN-based, enhanced-mode FET semiconductor structure, the desired operating characteristics of such a structure can be readily achieved using a GaN-based, depletion mode structure having similar operating characteristics. That is, as detailed below, the present invention combines a GaN-based, depletion-mode FET with one or more other components so that the resulting device acts as an enhancement-mode FET. For instance, in one particular embodiment of the invention the GaN-based depletion mode FET is arranged in series with an enhancement mode FET to provide an enhancement mode device that in other respects has the characteristics of the GaN-based, depletion mode FET.

Individual FET devices can be connected in various known ways, e.g., common source, common gate, common drain, source follower, etc. to provide different characteristics of operation as desired to suit a particular purpose. Two such devices can also be connected together to provide a variety of possible input and output characteristics which are not obtainable with just one device. One example of this is the commonly used "cascode" configuration, in which a first-stage device is connected in a common-source configuration, with its output going to the input of a second device connected in a common-gate configuration. The resulting structure is a device having a high input impedance, low noise, and a high gain.

Figure 2:
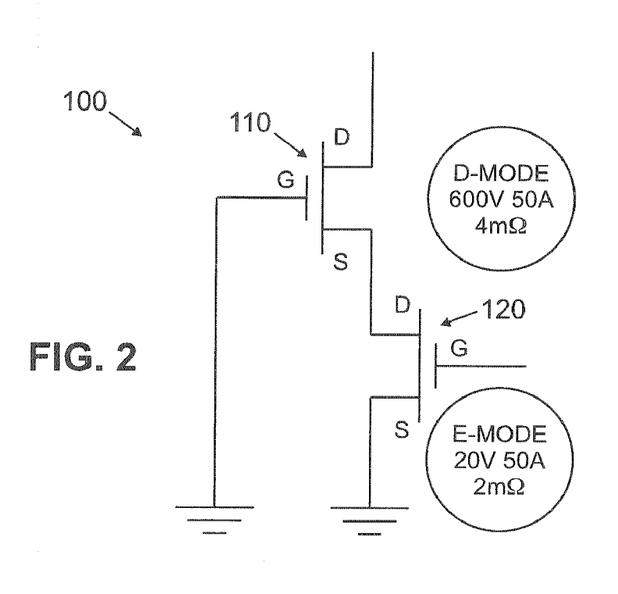
FIG. 2 shows one example of a circuit constructed in accordance with the present invention.

FIG. 2 shows one example of a circuit 100 constructed in accordance with the present invention. The source of a GaN-based, depletion mode FET 110 is connected to the drain of an enhancement mode FET 120. The enhancement mode FET 120 may be, for example, a commonly available silicon- or GaAs-based device. The gate of the depletion mode FET 110 is grounded so the FET 110 is always on. In the example of FIG. 2 the on-state of the FET 120 is maintained by connecting the gate of the FET 110 to ground. The source of the enhancement mode FET 120 is grounded. The drain of the depletion mode FET 110 serves as the drain D of the circuit 100. The source of the enhancement mode FET 120 serves as the source S of the circuit 100. Likewise, the gate of the enhancement mode FET 120 serves as the gate G of the circuit 100.

Figure 3:
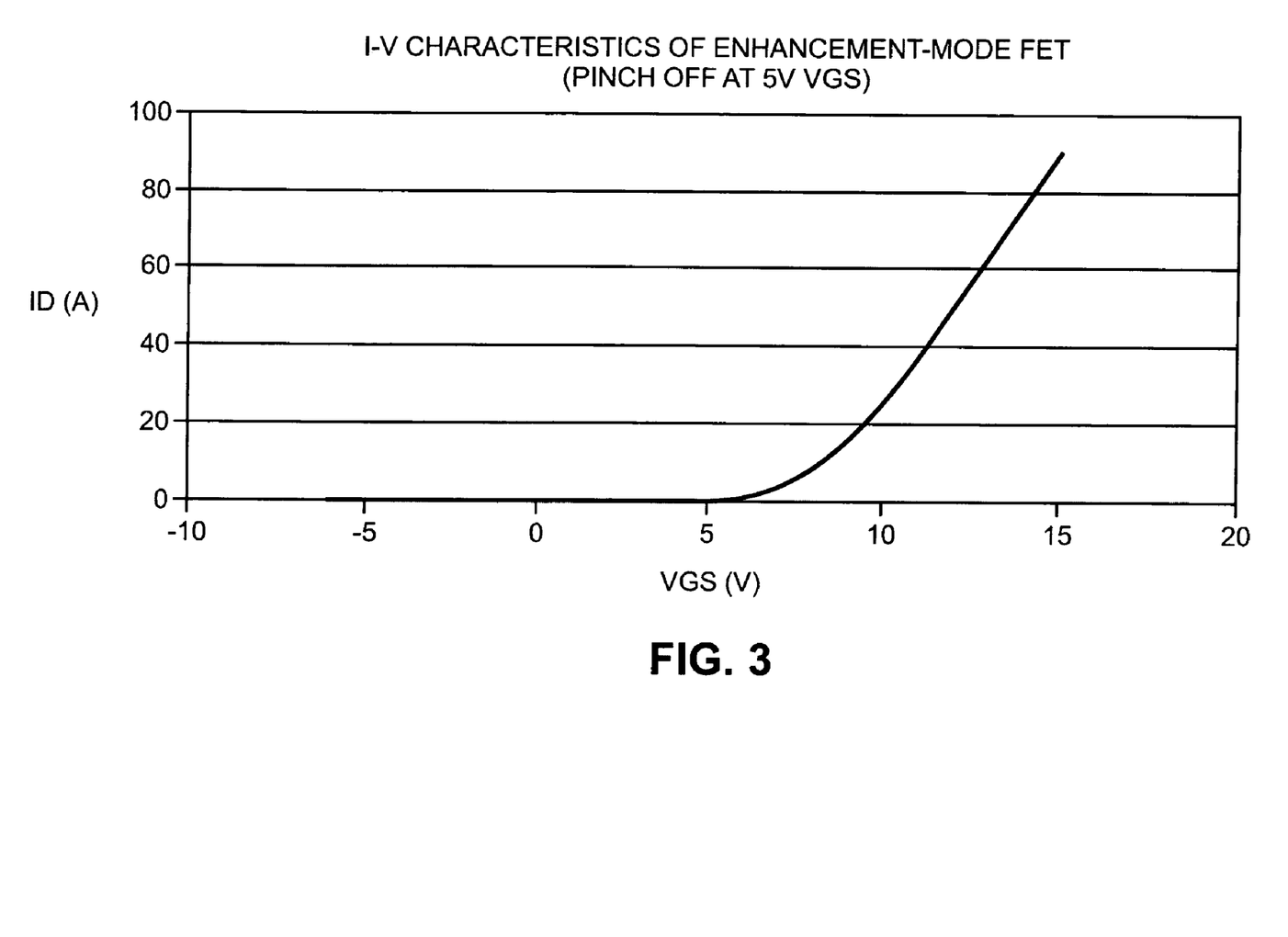
FIGS. 3 and 4 show current-voltage characteristic curves for the circuit shown in FIG. 2.
Figure 4:
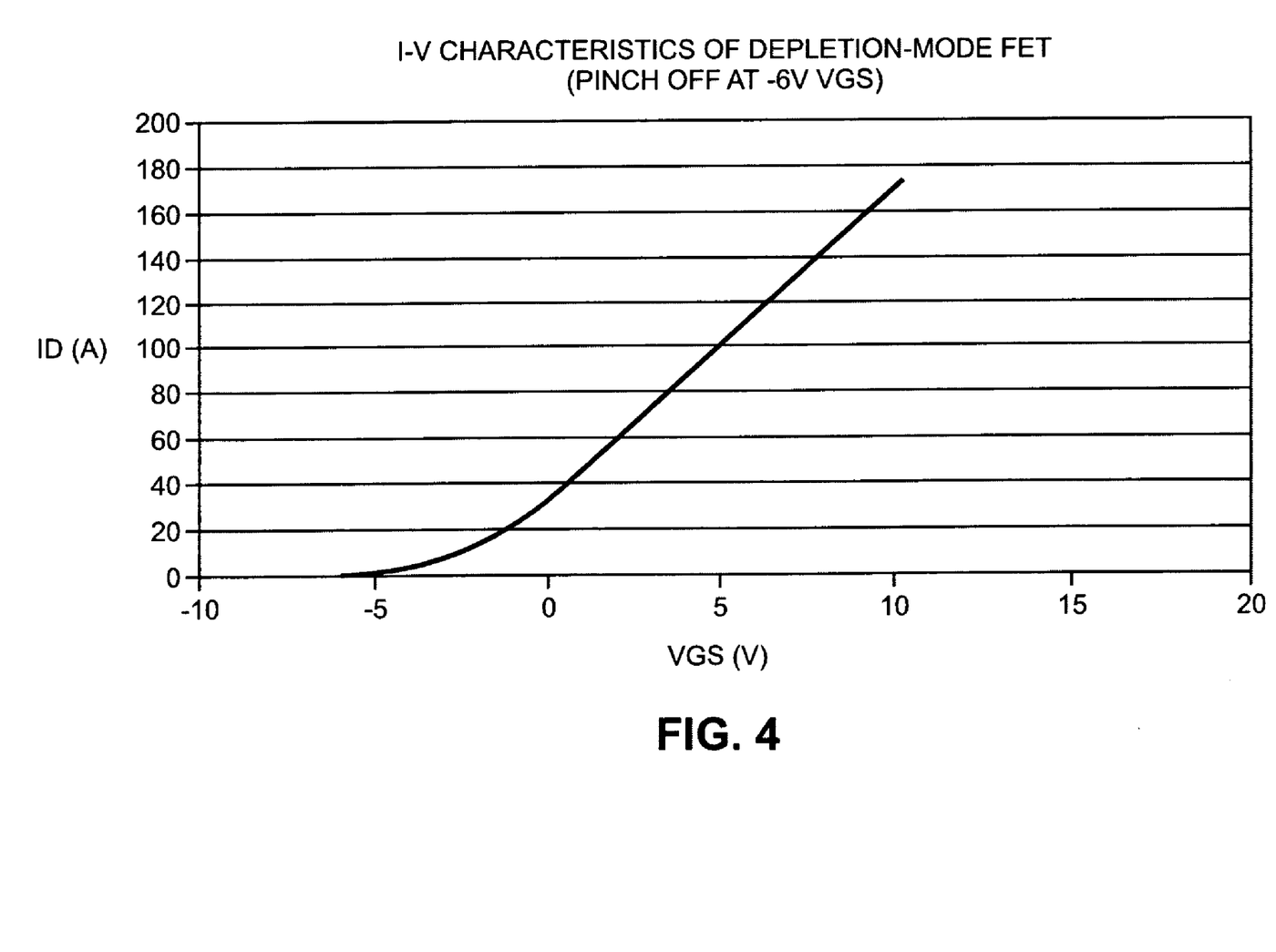

The operation of the circuit 100 may be explained with reference to the current-voltage characteristic curves shown in FIGS. 3 and 4. For purposes of illustration only and not as a limitation on the invention the both FETs 110 and 120 are n-type, but alternatively p-type devices may be used as well. FIG. 3 shows the current vs. gate-source voltage of the enhancement mode FET 120. In this example the pinch-off voltage of the FET 120 is shown to be 5V. FIG. 4 shows the current vs. gate-source voltage of the depletion mode FET 110. In this example the pinch-off voltage of the depletion mode FET 110 is shown to be −6V.

Figure 5:
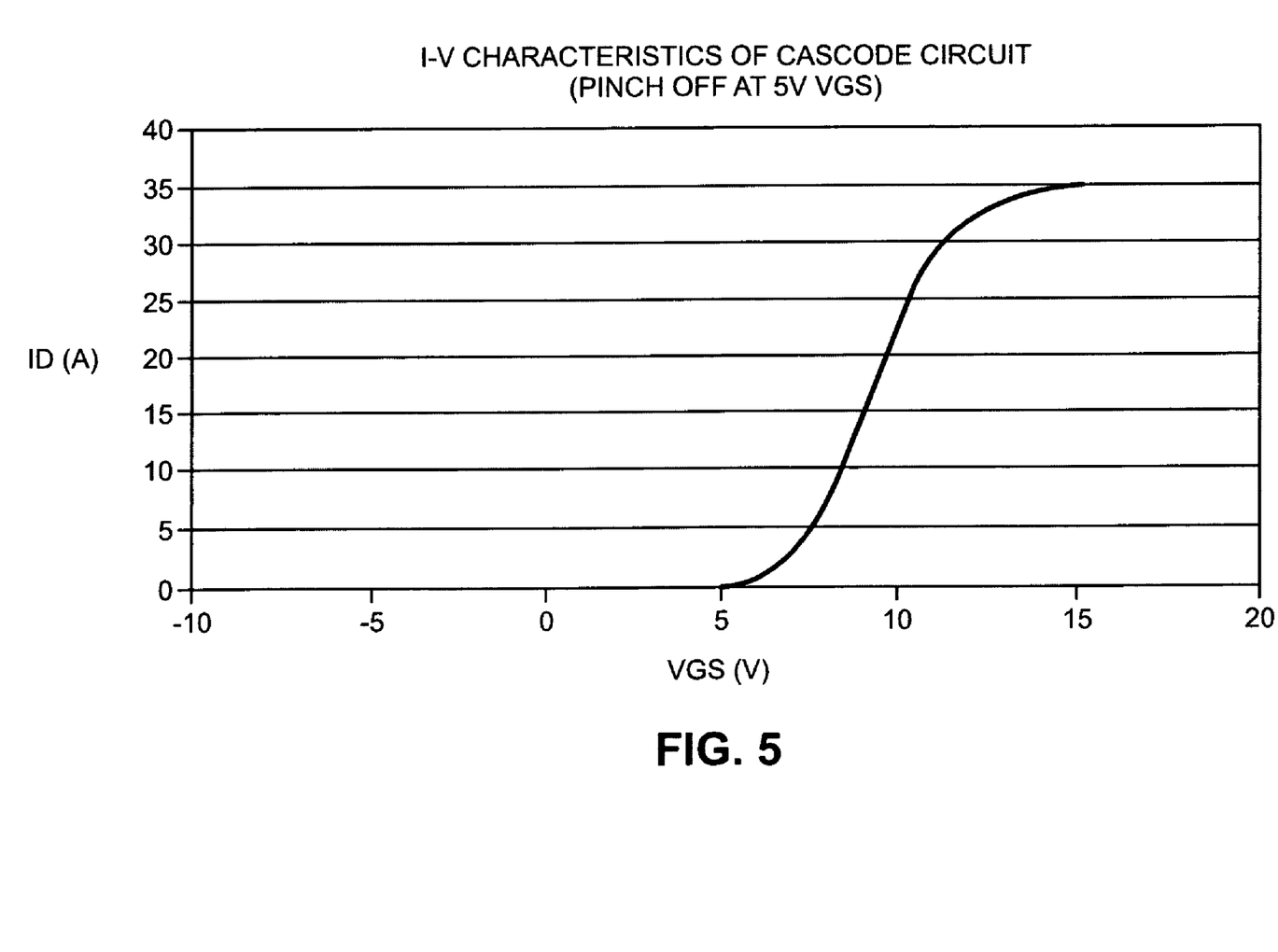
FIG. 5 shows the current vs. gate-source voltage of the circuit shown in FIG. 2.

FIG. 4 shows that the depletion mode FET 110 will remain in the on-state if the gate-to-source voltage VGS is 0V or more. Since in the example shown the gate of FET 110 is grounded, the depletion mode FET is always on. FIG. 3 shows that the enhancement mode FET 120 is always on if a gate-to-source voltage VGS of 5V or more is applied. Since current needs to flow along a path from the drain D of the depletion mode FET 110 to the source S of the enhancement mode FET 120, the circuit will be in its on state by changing the gate voltage G to a value of 5V of more, thereby acting like an enhancement mode FET. In this way the gate G of the enhancement mode FET 120 will modulate the current through the circuit 100 in the manner of an enhancement mode FET, while the blocking voltage of the depletion mode FET 110 provides the blocking capability of the entire circuit 100. The circuit 100 thus acts like a 600V GaN-based enhancement mode FET. FIG. 5 shows the current vs. gate-source voltage of the circuit 100.

In the example presented above the the GaN-based depletion mode FET 110 has a voltage rating of 600V and the voltage rating of the FET 120 is 20V. More generally, in some embodiments of the invention, the depletion mode FET is any suitable high voltage (e.g., V greater than about 100 V) FET. The output voltage of the circuit 100 generally will be about equal to the difference in voltage ratings between depletion mode FET 110 and enhancement mode FET 120. Accordingly, to maximize the voltage rating of the circuit 100 the voltage rating of the enhancement mode FET 120 is preferably selected to be as small as possible. The remaining characteristics of the circuit 100 such as its current rating and its drain-source resistance in the on-state, for example, will be similar to those of the depletion mode FET 110.

Figure 6:
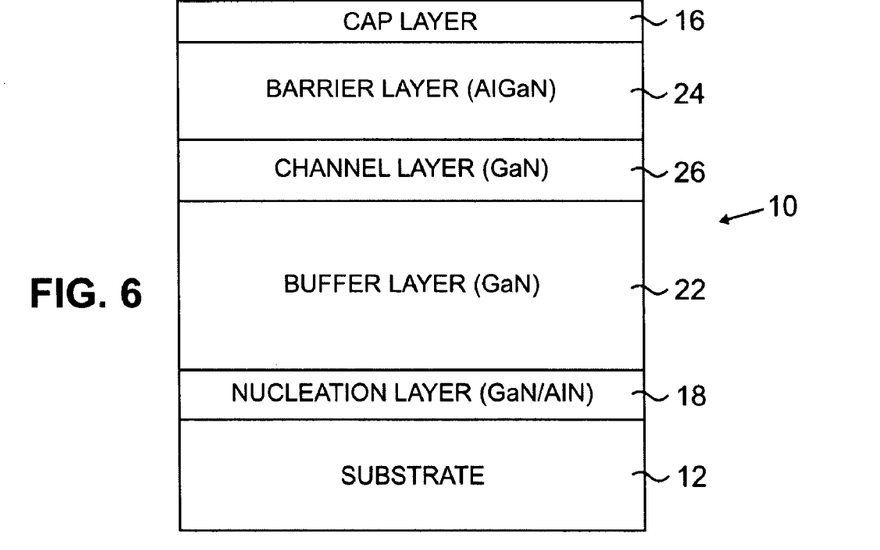
FIG. 6 shows one example of a gallium nitride based FET that may be employed in the circuit shown in FIG. 2.
Figure 7:
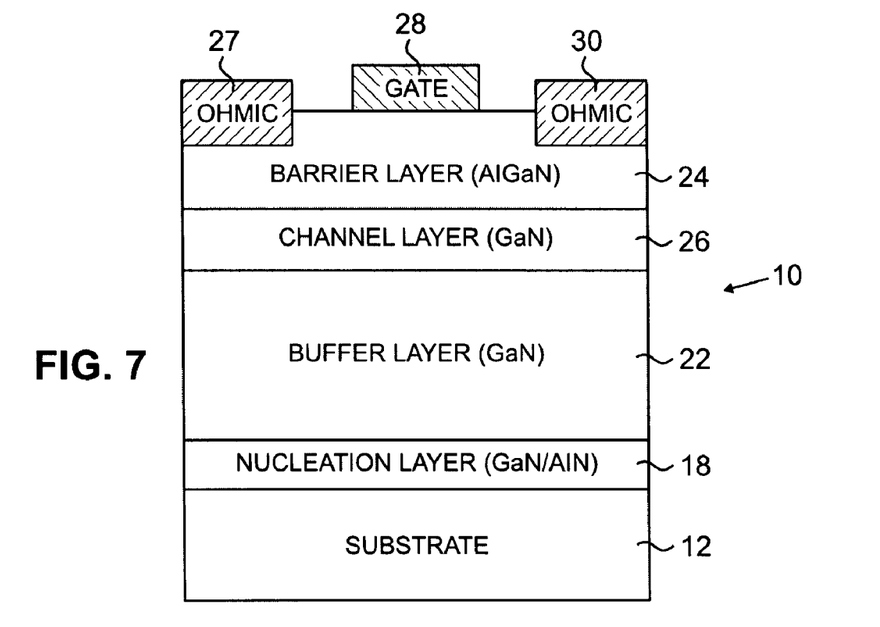
FIGS. 7 and 8 show alternative examples of a gallium nitride (GaN) FET that may be employed in the circuit shown in FIG. 2.
Figure 8:
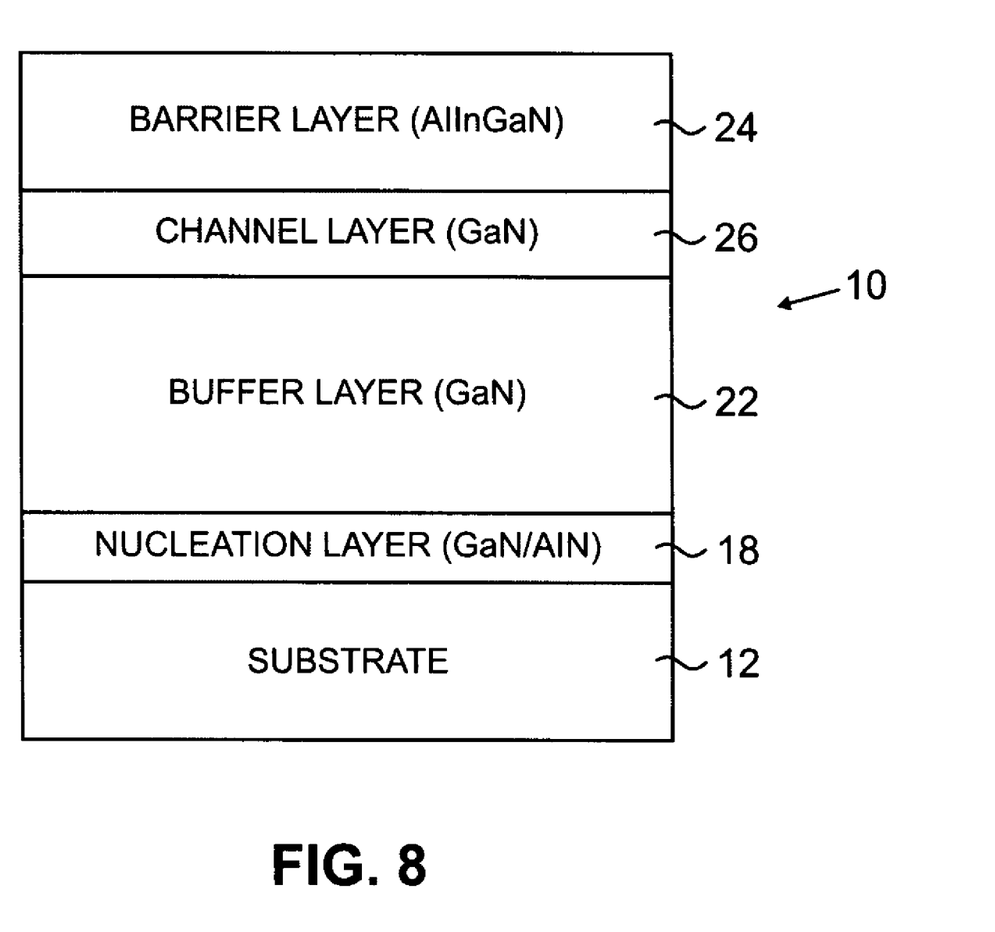

FIGS. 6-8 show some particular examples of the depletion mode FET 110 that may be employed in circuit 100. Of course, the present invention is not limited to these structures, which are shown for purposes of illustration only. In FIG. 6 depletion mode FET 10 includes a substrate 12, a nucleation (transitional) layer 18, a GaN buffer layer 22, an aluminum gallium nitride ($Al_xGa_{1-x}N$; 0<X<1) Schottky layer 24, and a cap or termination layer 16. Further, the FET 10 includes source contact 27, gate contact 28, and drain contact 30.

The FET 10 is typically fabricated using an epitaxial growth process. For instance, a reactive sputtering process may be used where the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, metal organic chemical vapor deposition (MOCVD) may be employed, wherein the substrate is exposed to an atmosphere containing organic compounds of the metals as well as to a reactive nitrogen-containing gas, such as ammonia, and a dopant-containing gas while the substrate is maintained at an elevated temperature, typically around 700-1100 C. The gaseous compounds decompose and form a doped semiconductor in the form of a film of crystalline material on the surface of the substrate 302. The substrate and the grown film are then cooled. As a further alternative, other epitaxial growth methods, such as molecular beam epitaxy (MBE) or atomic layer epitaxy may be used. Yet additional techniques that may be employed include, without limitation, Flow Modulation Organometallic Vapor Phase Epitaxy (FM-OMVPE), Organometallic Vapor-Phase Epitaxy (OMVPE), Hydride Vapor-Phase Epitaxy (HVPE), and Physical Vapor Deposition (PVD).

To begin the growth of the structure, the nucleation layer 18 is deposited on the substrate 12. The substrate 12 may be formed from various materials including, but not limited to, sapphire or silicon carbide (SiC). The nucleation layer 18 may be, for example, an aluminum rich layer such as $Al_XGa_{1-X}N$, where X is in the range 0 to 1. The nucleation layer 18 operates to correct a lattice mismatch between the GaN buffer layer 22 and the substrate 12. In general, a lattice mismatch is created when the spacing between atoms of one layer does not match the spacing between the atoms of an adjacent layer. As a result of the lattice mismatch, bonding between the atoms of the adjacent layers are weak, and the adjacent layers could crack, separate, or have a large number of crystalline defects. Therefore, the nucleation layer 18 operates to correct the lattice mismatch between the GaN buffer layer 22 and the substrate 12 by creating an interface between the crystalline structure of the substrate 12 and the crystalline structure of the GaN buffer layer 22.

After depositing the nucleation layer 18, the GaN buffer layer 22 is deposited on the nucleation layer 18, and the $Al_XGa_{1-X}N$ Schottky layer 24 is deposited on the GaN buffer layer 22. The two-dimensional conduction channel 26, which is a thin, high mobility channel, confines carriers to an interface region between the GaN buffer layer 22 and the $Al_XGa_{1-X}N$ Schottky layer 24. The cap or termination layer 16 is deposited on the $Al_XGa_{1-X}N$ Schottky layer 24 and serves to protect the $Al_XGa_{1-X}N$ Schottky layer 24 from surface reactions, such as oxidation, during fabrication and operation of the FET 10. Because the Schottky layer 24 includes aluminum, oxidation occurs if the $Al_XGa_{1-X}N$ Schottky layer 24 is exposed to air and is not otherwise protected.

After growth of the epitaxial layers 18, 22 and 24 and the termination layer 16 on the substrate 12, the FET 10 is completed by depositing the source, gate, and drain contacts 27, 28, and 30, respectively, on the termination layer 16. Each of the contacts 27, 28, and 30 are metallic contacts. Preferably, the gate contact 28 is a metallic material such as but not limited to nickel, gold, and the source and drain contacts 27 and 30, are each a metallic material such as but not limited to titanium, gold, or aluminum.

In one embodiment of the invention the termination layer 16 is an InGaN layer that is formed on the $Al_XGa_{1-X}N$ Schottky layer 24. The InGaN layer 16 serves two purposes, the first of which is to provide an upper layer that does not include Al so that oxidation is reduced. Moreover, by using an InGaN material instead of a material that includes Al, the growth process may be simplified since Al-containing compounds such as InGaAlN generally require higher growth temperatures to provide adequate uniformity and smoothness. In addition, the InGaN layer 24 slightly lowers the potential barrier at the surface, which can reduce the build up of surface charges and reduce the leakage current on the surface of the structure.

In another embodiment of the invention the termination layer 16 is a flash layer comprising Al metal. A flash layer is formed with a very short burst of material. This will form a very thin (e.g., 1-2 monolayers of material) but even coverage over the structure's surface. The flash layer is generally performed in situ. To ensure that metallic Al is formed and not AlN, the reactive nitrogen-containing gas (e.g., ammonia) that would otherwise be present when forming AlN is absent. The Al flash layer may be formed at high or low temperatures. After its formation, the Al can be subsequently annealed to form a thin oxide layer. Since the Al flash layer is very thin, it can be oxidized in its entirety, thus creating an initial "native" oxide on the material which then protects the Schottky layer 24 from undergoing any degradation of the type that is often seen in processing. This can also act as an additional barrier material for reduction of leakage currents and increase in breakdown voltage, both of which are important to HEMT performance. Instead of Al, the flash layer may comprise other metals such as gallium or even indium. The Ga or In flash layer can also be oxidized to form a uniform "native" oxide on the structure.

In yet other embodiments of the invention the cap or termination layer 16 may be formed from other materials such as highly Fe doped GaN, Si doped GaN, FeN or SiN. These layers, which may be epitaxial, nonepitaxial or even amorphous, can serve as initial passivation layers or as additional barrier materials to reduce leakage currents and increase breakdown voltages. For instance, the addition of Fe to GaN results in a material that can reduce the leakage current because the material is more insulating and reduces electron mobility.

In other embodiments of the invention, a thin AlN layer may be formed on the $Al_XGa_{1-X}N$ Schottky layer 24. This layer provides an additional Schottky barrier layer to help modulate the charge more efficiently, thus reducing the leakage current and increasing the breakdown voltage of the device. The AlN layer may also serve as an initial passivation layer for the structure, since the AlN can be easily wet etched to deposit ohmic contacts. Alternatively, the AlN layer may be oxidized to form a passivation layer.

In some embodiments, the termination layer 16 is approximately 1 to 5 nanometers thick. Therefore, electrons can easily tunnel through the termination layer 16. As a result, the termination layer 16 does not increase the Schottky barrier height between the gate contact 28 and the $Al_XGa_{1-X}N$ Schottky layer 24, where the Schottky barrier height defines a potential energy barrier encountered by electrons at the interface of the gate contact 28 and the $Al_XGa_{1-X}N$ Schottky layer 24. Further, the termination layer 16 does not affect the formation of the source and drain contacts 27 and 30.

FIG. 7 shows yet another embodiment of the FET 10 in which the ohmic contacts 27 and 28 are located in recesses formed in the $Al_XGa_{1-X}N$ Schottky layer 24. The recesses are formed by etching the $Al_XGa_{1-X}N$ Schottky layer 24 in accordance with conventional techniques. The recesses may extend partially or completely through the $Al_XGa_{1-X}N$ Schottky layer 24. For instance, in some cases the recess may extend to a depth of about 5 to 15 nm deep, thereby allowing a sufficient thickness of the $Al_XGa_{1-X}N$ Schottky layer 24 to remain to create the channel layer 26. By recessing the contacts in this manner the contact resistivity and the smoothness of the surface is reduced to increase the penetration of the metals deposited to form the ohmic contact. The increased surface roughness results in better metal migration into the semiconductor). For devices requiring low on-resistance, this arrangement can be significant in achieving the lowest possible on-resistance. While not shown, this embodiment of the invention may also employ a cap or termination layer such as those discussed above. In this case the recesses in which the contacts 27 and 28 are located will also extend through the termination layer.

FIG. 8 shows another embodiment of the FET 10 in which the barrier layer 24 is formed from AlInGaN instead of $Al_XGa_{1-X}N$. For instance, as discussed in M. Asif Khan et al., "Strain Energy Band Engineering in AlGaInN/GaN Heterostructure Field Effect Transistors," GAAS99, $Al_XIn_yGa_{(1-x-y)}N$ junctions are employed which have a barrier thickness less than 50 nm with alloy compositions that vary from x equals 0.1 to 0.2 and y equals 0.00 to 0.02). Furthermore, Khan et al. states that an Al/In ratio of 5 should be nearly lattice matched to GaN, based on a linear interpolation of lattice constants. By using AlInGaN the strain can be controlled independently of the bandgap, thereby allowing the bandgap of the material to be altered with more freedom in regards to critical thickness. For power devices this can be critical to obtain the most charge in the channel without unduly stressing the material and reducing device lifetime, which might otherwise occur as the material relaxes over time.

Although various embodiments are specifically illustrated and described herein, it will be appreciated that modifications and variations of the present invention are covered by the above teachings and are within the purview of the appended claims without departing from the spirit and intended scope of the invention. For example, while the depletion mode FET has been described as a GaN-based device, the invention more generally encompasses a depletion mode FET that is formed from any Group III nitride compound semiconductor in which the group III element may be gallium (Ga), aluminum (Al), boron (B) or indium (In).

The invention claimed is:

1. A circuit, comprising:
input drain, source and gate nodes;
a group III nitride depletion mode FET having a source, drain and gate, wherein the gate of the depletion mode FET is coupled to a potential that maintains the depletion mode FET in its on-state;
an enhancement mode FET having a source, drain and gate, wherein the source of the depletion mode FET is serially coupled to the drain of the enhancement mode FET; and
wherein the drain of the depletion mode FET serves as the input drain node, the source of the enhancement mode FET serves as the input source node and the gate of the enhancement mode FET serves as the input gate node, and
wherein the group III nitride depletion mode FET comprises:
a substrate;
a first active layer disposed over the substrate;
a second active layer disposed on the first active layer, the second active layer having a higher bandgap than the first active layer such that a two-dimensional electron gas layer arises between the first active layer and the second active layer;
a flash layer disposed on the second active layer; and
a source, gate and drain contact disposed on the flash layer.

2. The circuit of claim 1, wherein the first active layer comprises GaN and the second active layer comprises a group III nitride semiconductor material.

3. The semiconductor device according to claim 2, wherein the second active layer comprises $Al_xGa_{1-x}N$, wherein $0<X<1$.

4. The semiconductor device according to claim 2, wherein the second active layer is selected from the group consisting of AlGaN, AlInN, and AlInGaN.

5. The semiconductor device according to claim 1 further comprising a nucleation layer disposed between the substrate and the first active layer.

6. The semiconductor device according to claim 1 wherein the flash layer comprises metallic Al.

7. The semiconductor device according to claim 1 wherein the flash layer comprises metallic Ga.

8. The semiconductor device according to claim 1 wherein the flash layer is an annealed flash layer forming a native oxide layer.

9. The semiconductor device of claim 1 wherein the second active layer and the flash layer include first and second recesses formed therein and the source and drain contacts are disposed in the first and second recesses, respectively.

10. The circuit of claim 1 wherein the group III nitride depletion mode FET comprises:
a substrate;
a first active layer disposed over the substrate;
a second active layer disposed on the first active layer, the second active layer having a higher bandgap than the first active layer such that a two-dimensional electron gas layer arises between the first active layer and the second active layer;
an AlN layer formed over the second active layer; and
a source, gate and drain contact disposed over the AlN layer.

11. The circuit of claim 1 wherein the group III nitride depletion mode FET comprises:
a substrate;
a first active layer disposed over the substrate;
a second active layer disposed on the first active layer, the second active layer having a higher bandgap than the first active layer such that a two-dimensional electron gas layer arises between the first active layer and the second active layer, wherein the second active layer includes first and second recesses formed therein;
a source and drain contact disposed in the first and second recesses, respectively; and
a gate electrode disposed over the second active layer.

12. A circuit, comprising:
input drain, source and gate nodes;
a group III nitride depletion mode FET;
an enhancement mode FET arranged in series with the depletion mode FET and
wherein a first terminal of the depletion mode FET serves as the input drain node, and second and third terminals of the enhancement mode FET serve as the source and gate nodes, respectively,
wherein the group III nitride depletion mode FET comprises:
a substrate;
a first active layer disposed over the substrate;
a second active layer disposed on the first active layer, the second active layer having a higher bandgap than the first active layer such that a two-dimensional electron gas layer arises between the first active layer and the second active layer;
a flash layer disposed on the second active layer; and
a source, gate and drain contact disposed on the flash layer.

13. The circuit of claim 12 wherein the group III nitride depletion mode FET comprises:
a substrate;
a first active layer disposed over the substrate;
a second active layer disposed on the first active layer, the second active layer having a higher bandgap than the first active layer such that a two-dimensional electron gas layer arises between the first active layer and the second active layer;
an AlN layer formed over the second active layer; and
a source, gate and drain contact disposed over the AlN layer.

14. The circuit of claim 12 wherein the group III nitride depletion mode FET comprises:
a substrate;
a first active layer disposed over the substrate;
a second active layer disposed on the first active layer, the second active layer having a higher bandgap than the first active layer such that a two-dimensional electron gas layer arises between the first active layer and the second active layer, wherein the second active layer includes first and second recesses formed therein;

a source and drain contact disposed in the first and second recesses, respectively; and a gate electrode disposed over the second active layer.

15. The circuit of claim 12, wherein the first active layer comprises GaN and the second active layer comprises a group III nitride semiconductor material.

16. The semiconductor device according to claim 12 wherein the flash layer comprises metallic Al.

* * * * *